(12) United States Patent
Hiller et al.

(10) Patent No.: US 8,958,210 B2
(45) Date of Patent: Feb. 17, 2015

(54) MODULAR CONVERTER CABINET SYSTEM

(75) Inventors: Marc Hiller, Lauf an der Pegnitz (DE); Anton Pfauser, Pommersfelden (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 14/110,268

(22) PCT Filed: Mar. 19, 2012

(86) PCT No.: PCT/EP2012/054766
§ 371 (c)(1),
(2), (4) Date: Oct. 7, 2013

(87) PCT Pub. No.: WO2012/136465
PCT Pub. Date: Oct. 11, 2012

(65) Prior Publication Data
US 2014/0022738 A1   Jan. 23, 2014

(30) Foreign Application Priority Data
Apr. 7, 2011   (DE) .................. 10 2011 006 987

(51) Int. Cl.
*H05K 5/00*   (2006.01)
*H05K 7/14*   (2006.01)
(Continued)

(52) U.S. Cl.
CPC ............ *H05K 5/0021* (2013.01); *H05K 7/1432* (2013.01); *H02M 7/003* (2013.01); *H02M 2007/4835* (2013.01)
USPC ....................................... 361/730

(58) Field of Classification Search
CPC ........... G06F 1/18; G06F 1/181; G06F 1/182; G06F 1/183; G06F 1/189; G06F 1/1635; G11B 33/12; H05K 5/0091; H05K 7/005; H05K 7/023; H05K 7/026; H05K 1/0254; H05K 5/0017; H05K 5/0021; H05K 5/0065
USPC ..................... 361/730, 679.01, 728, 729, 735
See application file for complete search history.

(56) References Cited

U.S. PATENT DOCUMENTS 6,340,851 B1   1/2002   Rinaldi et al.
7,577,008 B2   8/2009   Hiller
(Continued)

FOREIGN PATENT DOCUMENTS

DE   298 13 254 U1   10/1998
DE   101 03 031 A1   1/2001
(Continued)

OTHER PUBLICATIONS

Der Umrichter für höchste Anforderungen Zuverlässig, präzise und langlebig; ROBICON Perfect Harmony Bestell-Nr.: E20001-A10-P590 Mar. 2008 Siemens AG 2008; 2008; DE; tranlsated as: Which medium-voltage Drive fulfills highest Demands to Availability and Versatility? (Translation attached).
(Continued)

*Primary Examiner* — Tremesha S Willis
(74) *Attorney, Agent, or Firm* — Henry M. Feiereisen LLC

(57) ABSTRACT

A modular converter cabinet system of a converter having phase modules with upper and lower converter valves, wherein each converter valve has at least two converter cells and a branch inductor connected in series, includes a first valve cabinet, a second valve cabinet, and an inductor cabinet. The first and second valve cabinets each have several vertically spaced valve levels and several honeycomb cells arranged next to one another. The inductor cabinet has several vertically spaced phase levels. Two valve levels of at least one of the first and second valve cabinets are electrically connected to a respective phase level of the inductor cabinet that is arranged next to the at least one valve cabinet. A converter cabinet system which can be individually adapted to different converter output voltages in a simple manner is thus obtained.

17 Claims, 8 Drawing Sheets

(51) Int. Cl.
*H02M 7/00* (2006.01)
*H02M 7/483* (2007.01)

(56) References Cited

U.S. PATENT DOCUMENTS

| | | |
|---|---|---|
| 7,835,166 B2 | 11/2010 | Hiller |
| 2007/0046252 A1 | 3/2007 | Aiello et al. |
| 2007/0048561 A1 | 3/2007 | Aiello et al. |
| 2008/0198630 A1 | 8/2008 | Hiller |
| 2008/0232145 A1 | 9/2008 | Hiller |
| 2008/0259661 A1 | 10/2008 | Hiller |
| 2011/0018481 A1 | 1/2011 | Hiller |
| 2011/0049994 A1 | 3/2011 | Hiller |
| 2011/0089873 A1 | 4/2011 | Hiller |
| 2011/0134666 A1 | 6/2011 | Hiller |
| 2011/0134667 A1 | 6/2011 | Hiller et al. |
| 2012/0105235 A1 | 5/2012 | Hiller |
| 2012/0147636 A1 | 6/2012 | Hiller |

FOREIGN PATENT DOCUMENTS

| | | |
|---|---|---|
| DE | 10 2005 041 087 A1 | 3/2007 |
| EP | 1 113 570 A1 | 7/2001 |
| EP | 1 920 528 B1 | 11/2010 |
| WO | WO 2011/008514 A2 | 1/2011 |

OTHER PUBLICATIONS

Der wassergekühlte Mittelspannungsumrichter der Wahl—Maximale Effizienz, Netzqualität und Sicherheit; Siemens-Broschüre "ROBICON Perfect Harmony" Siemens AG 2009 Destell-Nr.: E20001-A40-P590 gedruckt Jul. 2009; DE; translated as: The Sater-Cooled medium-voltage Drive of Choice (Translation attached).

Der Umrichter für höchste Anforderungen—Zuverlässig, präzise und langlebig (Which medium-voltage drive fulfills highest demands to availability and versatility?) Siemens brochure "ROBICON Perfect Harmony", order No. E20001-A10-P590, printed: Mar. 2008, Germany Siemens AG, 2008.

Der wassergekühlte Mittelspannungsumrichter der Wahl—Maximale Effizienz, Netzqualität und Sicherheit; (The water-cooled medium-voltage drive of choice) Siemens brochure "ROBICON Perfect Harmony", order No: E20001-A40-P590, printed: Jul. 2009, Germany Siemens AG, 2009.

US 8,958,210 B2

MODULAR CONVERTER CABINET SYSTEM

CROSS-REFERENCES TO RELATED APPLICATIONS

This application is the U.S. National Stage of International Application No. PCT/EP2012/054766, filed Mar. 19, 2012, which designated the United States and has been published as International Publication No. WO 2012/136465 A2 and which claims the priority of German Patent Application, Serial No. 10 2011 006 987.9, filed Apr. 7, 2011, pursuant to 35 U.S.C. 119(a)-(d).

BACKGROUND OF THE INVENTION

The invention relates to a modular converter cabinet system of a converter comprising at least one phase module having an upper and a lower converter valve, wherein each converter valve has at least two converter cells and a branch inductor, which are electrically connected in series.

Such a converter, which is also referred to as a Modular Multilevel Converter (M2LC), is known from DE 101 03 031 A1. An equivalent circuit diagram of such a three-phase converter is shown in greater detail in FIG. 1 wherein P is a positive voltage terminal of an applied DC voltage connected to a positive bus bar $P_0$ and N is a negative voltage terminal of an applied DC voltage connected to a negative bus bar $N_0$.

In accordance with this equivalent circuit diagram, this converter has three phase modules 1, 3 and 5, which each have an upper and a lower converter valve T1, T2 or T3, T4 or T5, T6 and each have a branch inductor $L_{T1}$, $L_{T2}$ or $L_{T3}$, $L_{T4}$ or $L_{T5}$, $L_{T6}$. Each converter valve T1, . . . , T6 of these phase modules 1, 3 and 5 has at least two converter cells 2, which are electrically connected in series. In the equivalent circuit diagram shown each converter valve T1, . . . , T6 has four such converter cells 2. The equivalent circuit diagram of a converter cell 2 of the M2LC is shown in greater detail in FIG. 2. Each branch inductor $L_{T1}, \ldots, L_{T6}$ is electrically connected in series with the series circuit of a number of converter cells 2 of a converter valve T1, . . . , T6. By means of these converter cells 2 of the converter valves T1, T2 or T3, T4 or T5, T6 of each phase module 1 or 3 or 5 of the M2LC a stepped output voltage is generated at each output L1 or L2 or L3 of each phase module 1 or 3 or 5. The more converter cells 2 are used per converter valve T1, . . . , T6, the smoother is the output voltage at output L1 or L2 or L3. The smoother these output voltages are the lower is the outlay for an output filter.

The layout of a converter cell 2, for which the equivalent circuit diagram is shown in greater detail in FIG. 2, is likewise known from DE 10 103 031 A1. A so-called two pole subsystem 4 is provided as the converter cell 2, having two disconnectable semiconductors $T_{11}$ and $T_{12}$, two diodes $D_{11}$ and $D_{12}$ and a storage capacitor $C_{SM}$. The two disconnectable semiconductors $T_{11}$ and $T_{12}$, especially Insulated Gate Bipolar Transistors (IGBTs), are electrically connected in series. This series circuit is electrically connected in parallel with the storage capacitor $C_{SM}$. Each diode $D_{11}$ or $D_{12}$ is electrically connected antiparallel with a disconnectable semiconductor $T_{11}$ or $T_{12}$. This means that these diodes $D_{11}$ and $D_{12}$ are also referred to as freewheeling diodes. A terminal X2 of the converter cell 2 is formed by the connection point of the two disconnectable semiconductors $T_{11}$ and $T_{12}$ of the two-pole subsystem 2, while a further terminal X1 of the converter cell 2 is formed by the negative pole of the storage, capacitor $C_{SM}$, which is connected electrically-conductively with an anode terminal of the diode $D_{12}$ and an emitter terminal of the disconnectable semiconductor $T_{12}$. A cell voltage $V_{X21}$ is present at these terminals X2 and X1 of the converter cell 2. At the storage capacitor $C_{SM}$, especially an electrolytic capacitor, a capacitor voltage $V_{SM}$ is present. The amplitude of the cell voltage $V_{X21}$, depending on the switching state of the two disconnectable semiconductors $T_{11}$ and $T_{12}$ can be equal to the amplitude of the capacitor voltage $V_{SM}$ or can amount to 0V. Further details of the converter in accordance with FIG. 1 and the converter cell 2 in accordance with FIG. 2 can be found in DE 10 103 031 A1.

FIG. 3 shows an equivalent circuit diagram of a so-called double submodule 6, which can likewise be used as a converter cell 2. Such a double submodule 6 is known from DE 10 2005 041 087 A1. This double submodule 6, in accordance with the equivalent circuit diagram, has four disconnectable semiconductors $T_{11}$, $T_{12}$, $T_{21}$ and $T_{22}$, especially IGBTs, four diodes $D_{11}$, $D_{12}$, $D_{21}$ and $D_{22}$, and two storage capacitors $C_{SM}$. An electronic module of the double submodule 6 shown in DE 10 2005 041 087 A1 is not shown explicitly here. These four disconnectable semiconductors $T_{11}$, $T_{12}$, $T_{21}$ and $T_{22}$ are electrically connected in series. Each of these disconnectable semiconductors $T_{11}$, $T_{12}$, $T_{21}$ and $T_{22}$ has a diode $D_{11}$, $D_{12}$, $D_{21}$ and $D_{22}$ connected electrically antiparallel to it. A storage capacitor $C_{SM}$ is connected electrically in parallel in each case to two disconnectable semiconductors $T_{11}$, $T_{12}$ or $T_{21}$, $T_{22}$ each electrically connected in series. These two storage capacitors $C_{SM}$, especially electrolytic capacitors, are additionally electrically connected in series. The terminal X2 of the converter cell 2 is formed by the connection point of the two disconnectable semiconductors $T_{11}$ and $T_{12}$ and the terminal X1 of the converter cell 2 is formed by the connection point of the two disconnectable semiconductors $T_{21}$ and $T_{22}$. A cell voltage $V_{X21}$ is present at these two terminals X2 and X1, which by comparison with the embodiment of the converter cell 2 in accordance with FIG. 2, has four potential stages. Further details of this double submodule 6 are to be found in DE 102005041087 A1.

Since the converter depicted in FIG. 1 has a plurality of converter cells 2 in accordance with FIGS. 2 and 3, this converter belongs to the so-called cell converters. The cell converters also include the cell converter "ROBICON Perfect Harmony" made by Siemens, which is described in more detail in the Siemens brochure entitled "Der Umrichter für höchste Anforderungen" (The converter for the highest requirements) with the order number E20001-A10-P590 and the publication date March 2008. This known cell converter has an intermediate voltage circuit converter as its converter cell, which generates a single-phase alternating voltage from the three phase alternating voltage. To this end each intermediate voltage circuit converter on the supply side has a six-pulse diode bridge and on the load side has a four-pulse IGBT bridge. Both bridge circuits are connected to one another electrically-conductively on the DC voltage side by means of an intermediate circuit capacitor. Each phase of this cell converter has four converter cells which are electrically connected in series on the load side. Each converter cell is linked on the supply side to a three-phase secondary winding system of a mains converter transformer. In other words, the cell converter described in the said Siemens brochure has a converter transformer with twelve three-phase secondary winding systems. If six converter cells are used for each phase of the cell converter, a converter transformer with eighteen three-phase secondary winding system is already needed. The three phases of this cell converter are connected in a star configuration, to the free ends (phase terminals) of which a load, for example an AC motor, can be connected. On page 10 of this brochure a valve cabinet with 12 converter cells is shown in the left-hand picture in the center, wherein converter cells of one phase are arranged alongside one another at a valve level of the valve cabinet. Since this cell converter has three phases, three valve levels, which are arranged spaced-apart above one another, are provided in the valve cabinet. Each valve level accommodates the converter cells of one phase, wherein these are arranged next to one another within a valve level. An inductor cabinet, in which the converter transformer is accommodated, can also be seen in this picture.

A further embodiment of the cell converter of the Siemens brochure is known from EP 1 920 528 B1 which, instead of a six-pulse diode bridge of each converter cell, has a self-commutated pulse converter. Such a self-commutated pulse converter on the supply side is also referred to as an Active Front End (AFE). The use of an AFE for each converter cell of this three-phase cell converter now enables power to be fed back into a network. In addition this AFE can be controlled such that the power factor is cos=1 and that the intermediate circuit voltage of each converter cell can be regulated to a predetermined constant amount. A converter cell as a constructional unit is shown in FIG. 5 of this EP patent. FIG. 6 of this EP patent shows a support structure for accepting a number of converter cells. This support structure comprises a number of support rails, a backplane circuit board, two guide rails for a converter cell in each case and two side walls. The backplane circuit board has terminals for each converter cell. The guide rails for the converter cells are disposed at three levels on the support rails, which mechanically connect the two side walls of this support structure to one another. This support structure is embodied for a three-phase cell converter with three converter cells per phase in each case Whether these converter cells of one phase are disposed in one level alongside one another or over three levels above one another, cannot be ascertained from this EP patent.

If a cell converter with a higher output voltage is needed, which lies in terms of amplitude above the value of the output voltage of the cell converter of the Siemens brochure, at least one further converter cell per phase must be provided. In order to be able to manufacture such a cell converter with five converter cells per phase in each case, the valve cabinet must be expanded by one converter cell width. At the same time the converter transformer must be provided with a further three-phase secondary winding system. These three further converter cells must each be connected to a further three-phase secondary winding system of the converter transformer electrically-conductively on the supply side and electrically connected in series with the four converter cells of a phase already present on the output side.

The Siemens brochure "Der wassergekühlte Mittelspannungsumrichter der Wahl" (The water-cooled medium-voltage converter of choice) with the order number E20001-A40-P590, published in July 2009, discloses how the overall weight of a intermediate voltage circuit converter with load-side cell converter increases as the level of the converter output voltage increases, wherein the change depends on the expansion in width of the valve cabinet. In accordance with the two said brochures the converter family "ROBICON Perfect Harmony" has a converter with a number of cabinets for different output voltages in each case. This converter family cannot be adapted individually to any given output voltages.

SUMMARY OF THE INVENTION

The underlying object of the invention is therefore to specify a modular converter system pro converter with a plurality of converter cells which can be easily adapted individually to different converter output voltages.

This object is achieved according to the invention by a modular converter cabinet system of a converter with at least one phase module having an upper and a lower converter valve, wherein each converter valve has at least two converter cells and a branch inductor which are electrically connected in series. The modular converter cabinet system includes a first valve cabinet, a second valve cabinet, and an inductor cabinet. The first and second valve cabinets each have a plurality of valve levels that are vertically spaced apart from one another and a plurality of honeycomb cells arranged next to one another, wherein the inductor cabinet has a plurality of phase levels that are vertically spaced apart from one another, and wherein two valve levels of at least one of the first and second valve cabinets are electrically connected to a respective phase level of the inductor cabinet that is arranged next to the at least one valve cabinet.

The fact that the converter cells of the converter valves of the phase modules of a converter mentioned at the start are accommodated in two valve cabinets, wherein the branch inductors are additionally built into a separate inductor cabinet, enables each valve cabinet to be combined individually with the inductor cabinet or a combination of the two valve cabinets with the inductor cabinet or a combination of a valve cabinet with the inductor cabinet to a converter. By the use of at least one first and/or second valve cabinet a converter construction is able to be adapted to a required converter output voltage.

In an advantageous embodiment of the modular converter system, a first valve cabinet has two honeycomb cells per valve level, whereas a second valve cabinet has four honeycomb cells per valve level. As a result, the second valve cabinet has twice as many honeycomb cells per valve level through which by combination of the first and the second valve cabinet or of the first and the number of second valve cabinets, converter valves of a cell converter can be constructed with two, four, six, eight, . . . converter cells. This means that the converter output voltage can be increased in each case in steps of two cell voltages. This enables the inventive modular converter cabinet to be individually adapted without any great effort to the required converter output voltage.

As already mentioned, each valve cabinet has a number of valve levels, which are spaced apart above one another. Accommodated at each valve level are the converter cells of a converter valve of a phase module of the cell converter mentioned at the start. With a three-phase embodiment this cell converter has three phase modules each with two converter valves. Each phase module likewise has two branch inductors which are connected electrically-conductively to an upper or a lower converter valve. A connection point of these two branch inductors forms a phase output L1 or L2 or L3, to which a terminal of a load is able to be connected. Thus the first and second valve cabinet have six valve levels. In which valve level the converter cells of one of the six converter valves are accommodated is initially not absolutely prescribed.

If however importance is attached to a simple direct current-side and/or inductor-side arrangement, an accommodation of the converter cells of a converter valve of the cell converter in each case is no longer random.

In an advantageous embodiment the converter cells of an upper and of a lower converter valve of a phase module of the multi-phase cell converter are accommodated in each case in neighboring valve levels. This enables each valve level to be connected electrically-conductively on the inductor side directly to a branch inductor of a corresponding phase level of the inductor cabinet. The arrangement on the direct current side is more complex, since the converter valves which are connected electrically-conductively to a DC voltage potential are disposed in each second valve level of the valve cabinet.

In a further advantageous embodiment of the modular converter cabinet system, the converter valves of the phase modules of the cell converter described at the start are distributed to the valve levels of a valve such that the converter cell of the upper converter valves of the three phase modules are accommodated in the three upper valve levels and the converter cells of the lower converter valves of the three phase modules in the three lower valve levels. This means that the bus bars of a positive DC voltage potential and the bus bars of a negative DC voltage potential are separated spatially from one another. This means that the DC voltage-side bus bar layout of the valve levels of a valve cabinet is especially simple. Account must be taken however of the fact that the inductor-side bus bar arrangement is more complicated.

In a further advantageous embodiment of the modular converter cabinet system the converter cells of the lower converter valves of the three phase modules of the cell converter are accommodated in the upper three valve levels of a valve cabinet, so that the converter cells of the upper converter valves of the three phase modules are now accommodated in the lower three valve levels of the valve cabinet. In such cases the converter cells of the lower converter valves are distributed in the upper valve levels and the converter cells of the upper converter valves in the lower valve levels such that the converter cells of a lower and upper converter valve of a phase module are accommodated in adjacent valve levels. This keeps the bus bar layout on the DC voltage side of the valve cabinet unchanged and simple, wherein the potentials are swapped. The bus bar layout on the inductor side is simplified by this arrangement, since at least the converter valves of one phase module are accommodated in neighboring valve levels, through which the associated branch inductors in the inductor cabinet can be linked directly to these converter valves.

Embodiments of a support structure of a valve cabinet, in which a plurality of converter cells of a cell converter are accommodated, may include one or more of the following features. The valve levels of a valve cabinet may be arranged between two superpositioned spaced-apart side walls. The two side walls may be spaced apart by two spacer bars disposed above the upper valve level and two spacer bars disposed below the lower valve level. Each side wall may have a cutout for each valve level on its front side. Cross bars may be arranged in the cutouts between two spaced-apart sidewalls. The support structure of a plurality of converter cells of a valve cabinet consisting of side walls, spacer bars and cross bars may be made of an electrically-insulating material.

Since different voltage potentials occur within a valve cabinet, the support structure consists of electrically-insulating material. This support structure is embodied such that in each valve level a corresponding number of honeycomb cells are arranged next to one another. These honeycomb cells are dimensioned such that each honeycomb cell can accommodate a converter cell of a converter valve. The honeycomb embodiment means that the converter cells accommodated have a bulkhead all around them, so that consequences of a converter cell error remain restricted locally.

BRIEF DESCRIPTION OF THE DRAWING

For further explanation of the invention the reader is referred to the drawing, in which an embodiment of an inventive modular converter cabinet system is illustrated schematically.

FIG. 6 shows an embodiment of a modular converter cabinet of the modular converter cabinet system, wherein

DETAILED DESCRIPTION OF PREFERRED EMBODIMENTS

Figure 3:
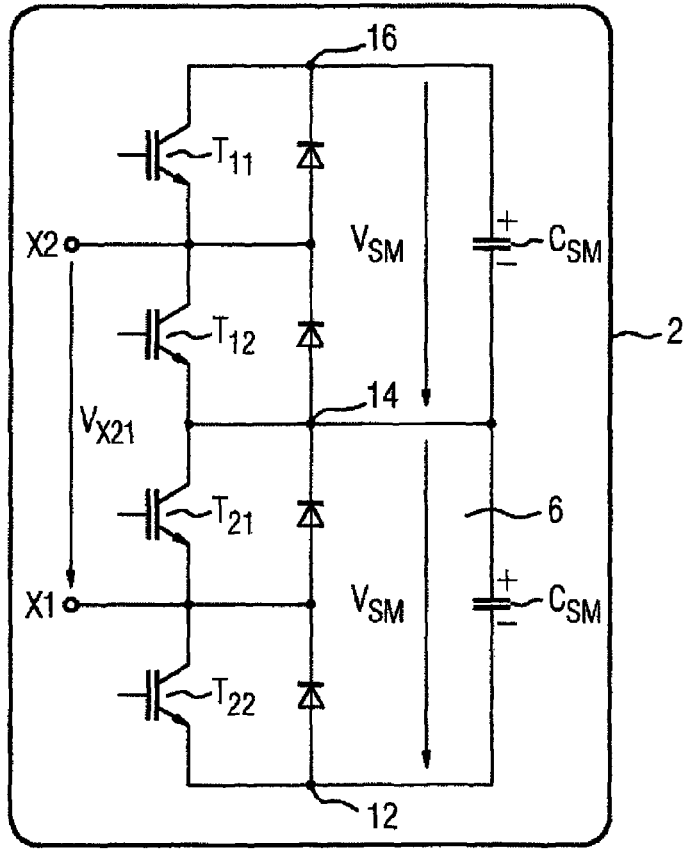
FIG. 3 shows a further equivalent circuit diagram of a converter cell of the cell converter in accordance with FIG. 1.
Figure 4:
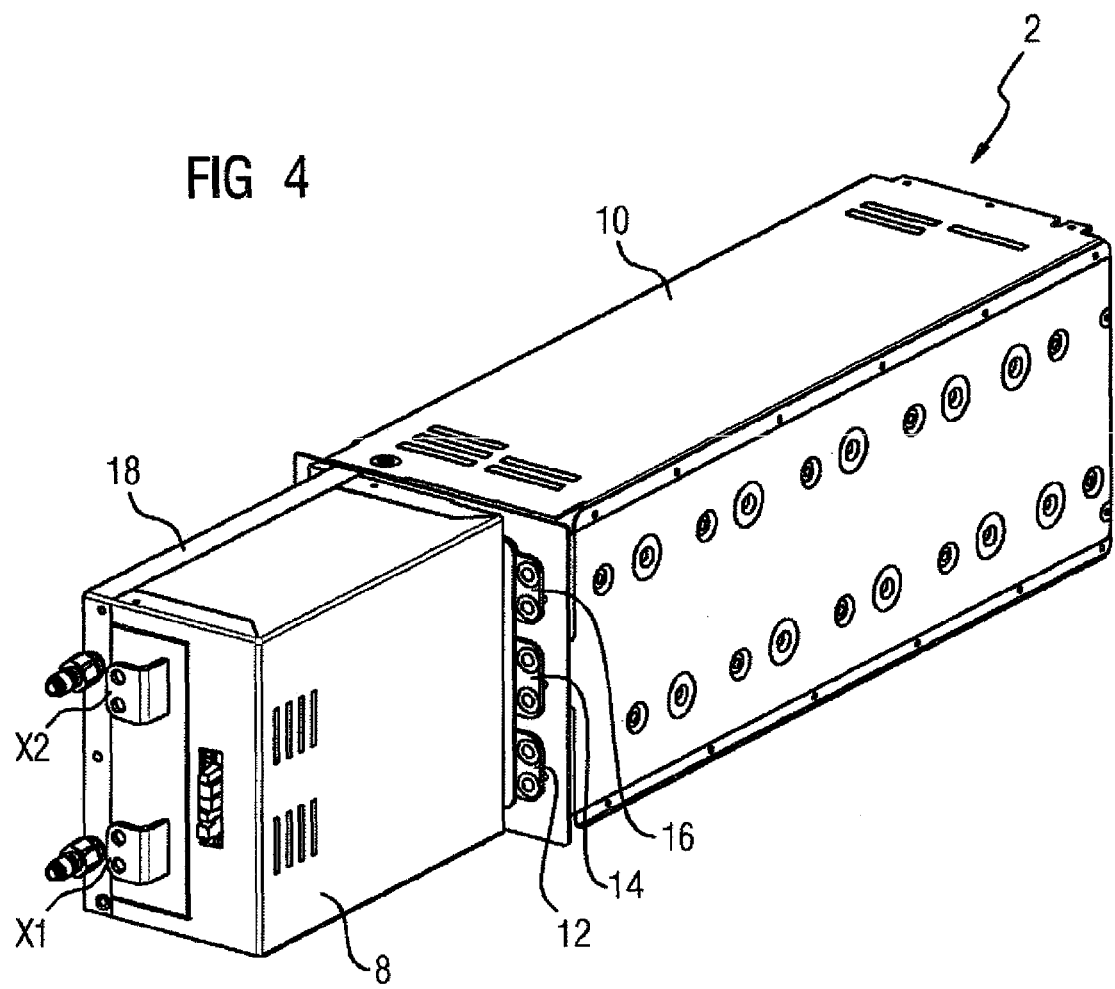
FIG. 4 shows a converter cell of the cell converter in accordance with FIG. 1.

FIG. 4 shows a converter cell 2 in accordance with the equivalent as depicted in FIG. 3. This converter cell 2 has two constructional units, namely a semiconductor unit 8 and a capacitor unit 10. These two constructional units 8 and 10 are connected to each other mechanically and electrically. The capacitor constructional unit 10, in addition to a plurality of electrolytic capacitors, also has a bus bar package, with which these electrolytic capacitors are connected to one another electrically in series and/or electrically in parallel. In accordance with the equivalent circuit diagram of FIG. 3 the capacitor constructional unit 10 has three terminals, which are linked electrically-conductively to three terminals 12, 14 and 16 of the semiconductor constructional unit 8. In this semiconductor constructional unit 8, as well as the semiconductors $T_{11}$, $T_{12}$, $T_{21}$, $T_{22}$, $D_{11}$, $D_{12}$, $D_{21}$ and $D_{22}$ a bus bar package and a heat sink 18 for these said semiconductors are accommodated. With this bus bar package these disconnectable semiconductors $T_{11}$, $T_{12}$, $T_{21}$, $T_{22}$ and their freewheeling diodes $D_{11}$, $D_{12}$, $D_{21}$ and $D_{22}$ are connected to one another in accordance with the equivalent circuit diagram of FIG. 3.

Figure 5:
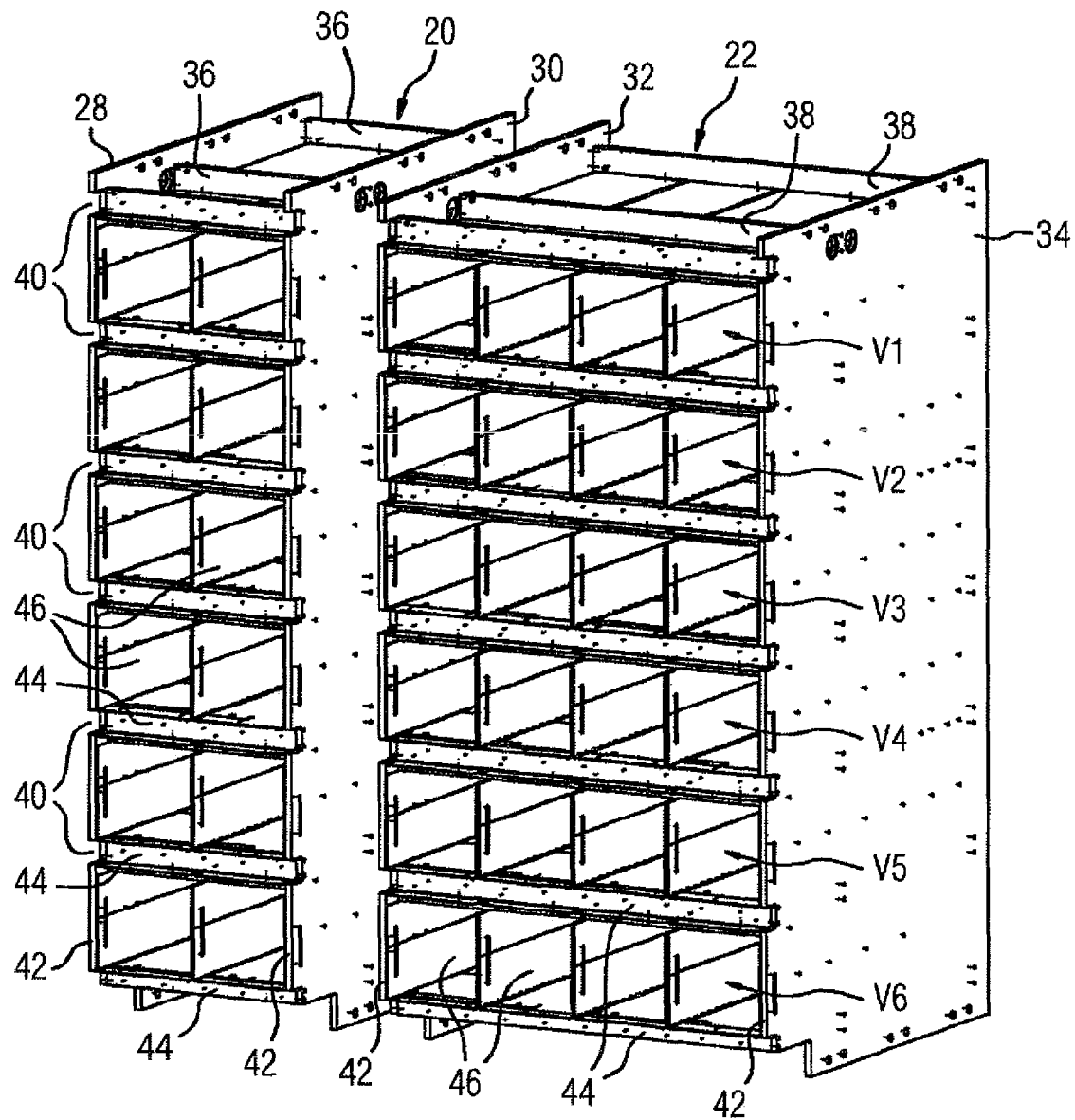
FIG. 5 shows the support structures of a first and second valve of the modular converter cabinet system in accordance with the invention in a perspective view next to one another.

FIG. 5 shows two support structures 20 and 22 of a first and a second valve cabinet 24 and 26. Each support structure 20 and 22 has two side walls 28 and 30 or 32 and 34, which are spaced apart from one another by means of spacer bars 36 or 38. Only the upper bar of these spacer bars 36 and 38 can be seen in this diagram. The side walls 28, 30, 32 and 34 have a plurality of cutouts 40 on their front side, which are each disposed in the narrow sides 42 of the side walls 28, 30, 32 and 34. Disposed in each cutout 40 are two sidewalls 28, 30 or 32, 34 of a support structure 20 or 22 of a first or second valve cabinet 24 or 26 is a cross bar 44. A valve level V1, V2, V3, V4, V5, V6 is disposed in each case between two cross bars 44, which in accordance with the support structure 20 of the first valve cabinet 24 in each case has two honeycomb cells 46 and in accordance with the support structure 22 of the second valve cabinet 26 has four honeycomb cells 46 in each case. Each honeycomb cell 46 is embodied such that a converter cell 2 in accordance with FIG. 4 can be accommodated.

Figure 6:
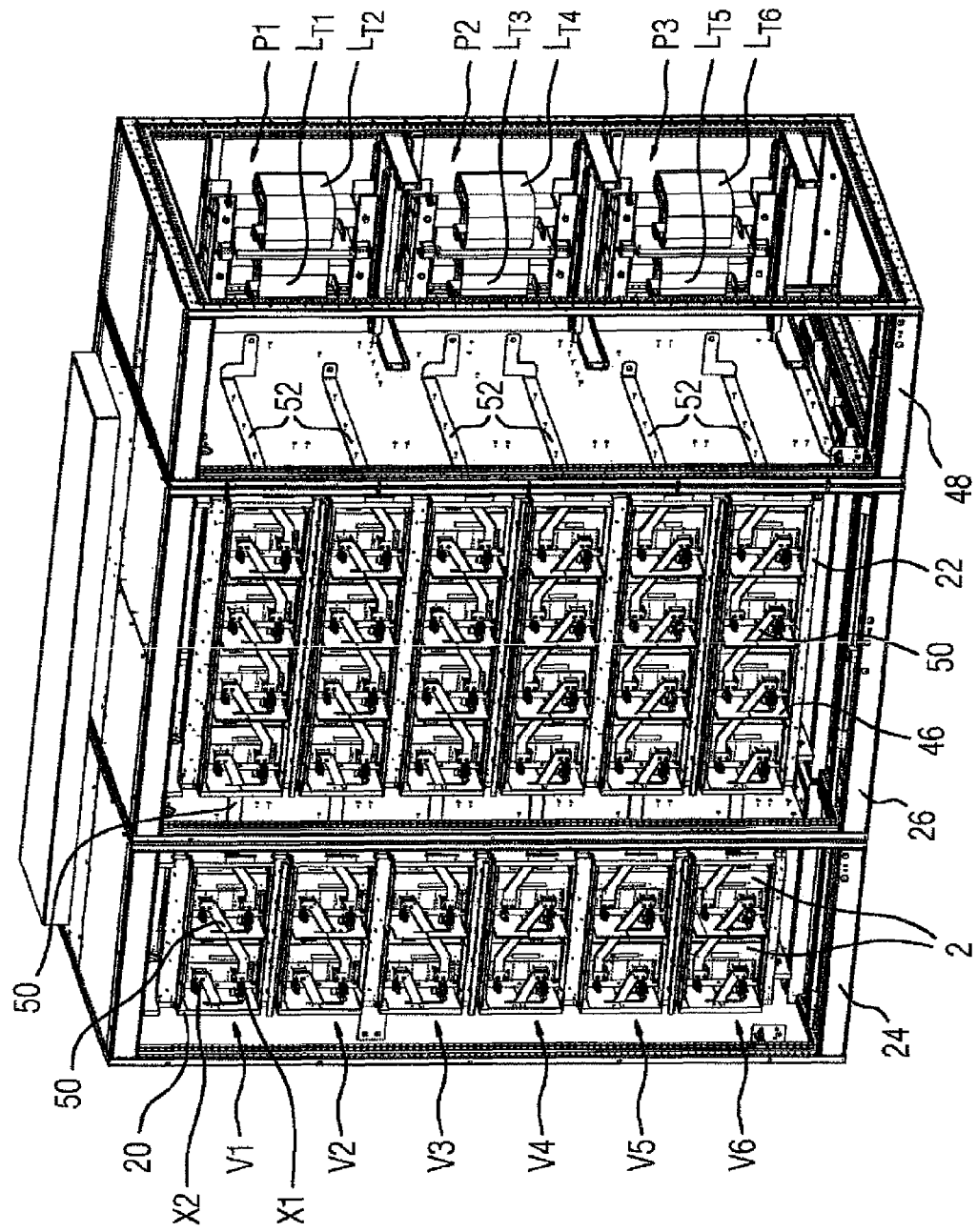

FIG. 6 shows an embodiment of an inventive modular converter cabinet system in greater detail. This modular converter cabinet system has a first valve cabinet 24, a second valve cabinet 26 and an inductor cabinet 48. Accommodated in the first valve cabinet 24 is the support structure 20 of FIG. 4, wherein each honeycomb cell 46 of this support structure 20 already has a converter cell 2 of the modular three-phase cell converter in accordance with FIG. 1. The support structure 22 of FIG. 4 is accommodated in the second valve cabinet 26. Its honeycomb cells 46 are also equipped with converter cells 2 of the modular three-phase cell converter in accordance with FIG. 1. In accordance with the embodiment of the modular cell converter of FIG. 1 the converter cells 2 of each one of the converter valves T1, . . . , T6 are connected electrically in series. This series connection of converter cells 2 is effected by means of bus bars 50 on the front side of these two valve cabinets 24 and 26. To this end a bus bar 50 connects the terminal X1 of a first converter cell 2 in each case to the terminal X2 of a next converter cell 2 within a valve level V1, . . . , V6 in each case. The terminals X1 or X2 of the second converter cell 2 of each of the valve levels V1, . . . , V6 of the first valve cabinet 24 are connected electrically-conductively by means of a bus bar 50 to the terminal X2 or X1 of the first converter cell 2 of each of valve levels V1, . . . , V6. The terminal X2 or X1 of the fourth converter cell 2 of each of the valve levels V1, . . . , V6 of the second valve cabinet 26 is connected electrically-conductively in each case by means of a bus bar 52 with a branch inductor $L_{T1}$, . . . , $L_{T6}$ of the inductor cabinet 48. A respective connection point of two branch inductors $L_{T1}$, $L_{T2}$ or $L_{T3}$, $L_{T4}$ or $L_{T5}$, $L_{T6}$ of each of the phase levels P1, P2 or P3 is for example taken out to the rear upwards or downwards from this inductor cabinet 48, so that a three-phase machine can be connected. In this embodiment of the two valve cabinets 24 and 26 of the inventive modular converter cabinet system, the honeycomb cells 46 of the valve levels V1, . . . , V6 are equipped, in accordance with the equipping plan depicted in FIG. 9, with converter cells in accordance with FIG. 4. This modular converter cabinet system shown in FIG. 6, compared to the equivalent circuit diagram of the modular cell converter shown in FIG. 1, has six converter cells 2 per converter valve T1, . . . , T6 instead of four converter cells 2, which are distributed between the first and second valve cabinet 24 and 26. Were the converter in accordance with the equivalent circuit diagram depicted in FIG. 1 to be realized as a converter cabinet system, then only the second valve cabinet 26 would have to be connected to the inductor cabinet 48. A further embodiment of this converter cabinet system consists of the first valve cabinet 24 being connected to the inductor cabinet 48. In further embodiments of the converter cabinet system at least two second valve cabinets 26 are connected electrically-conductively to an inductor cabinet 48 or at least two second valve cabinets 26 and a first valve cabinet 24 and an inductor cabinet 48 are connected electrically-conductively to one another.

With the aid of two basic valve cabinet types (valve cabinets 24 and 26) and one inductor cabinet 48, a converter cabinet system can be constructed in each case which is distinguished in each case by the number of converter cells 2 used. The individual configurations of the converter cabinet systems differ in each case by two converter cells 2 per converter valve T1 . . . T6. This means that the converter output voltage is increased from configuration to configuration by a doubled cell voltage $U_{X21}$. Thus a converter cabinet system can be created which is easily able to be adapted individually to the desired converter voltage.

Figure 1:
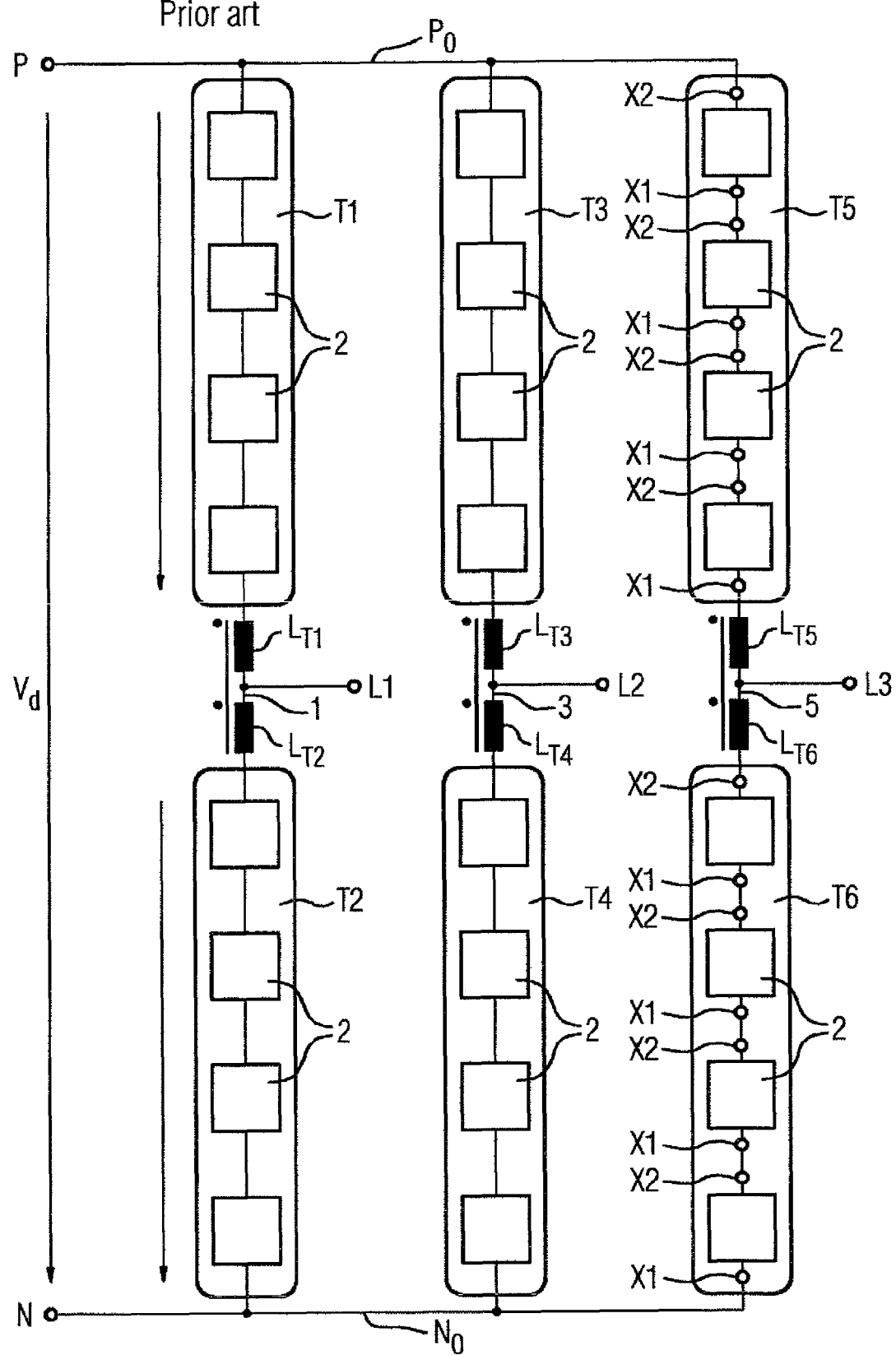
FIG. 1 shows an equivalent circuit diagram of a three-phase cell converter.
Figure 2:
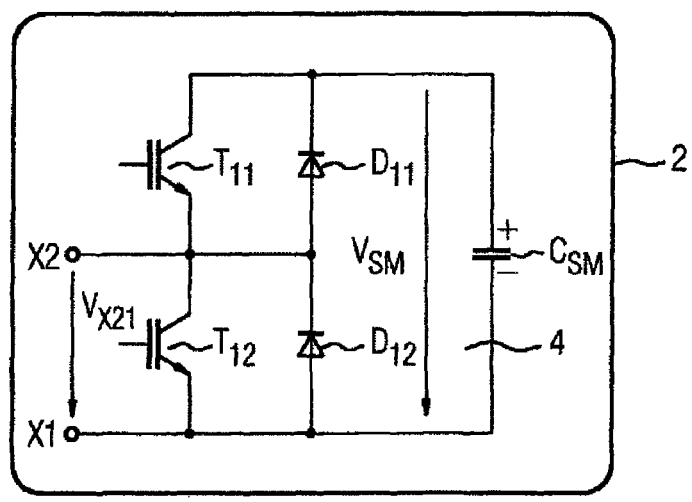
FIG. 2 shows an equivalent circuit diagram of a converter cell in accordance with FIG. 1.
Figure 7:
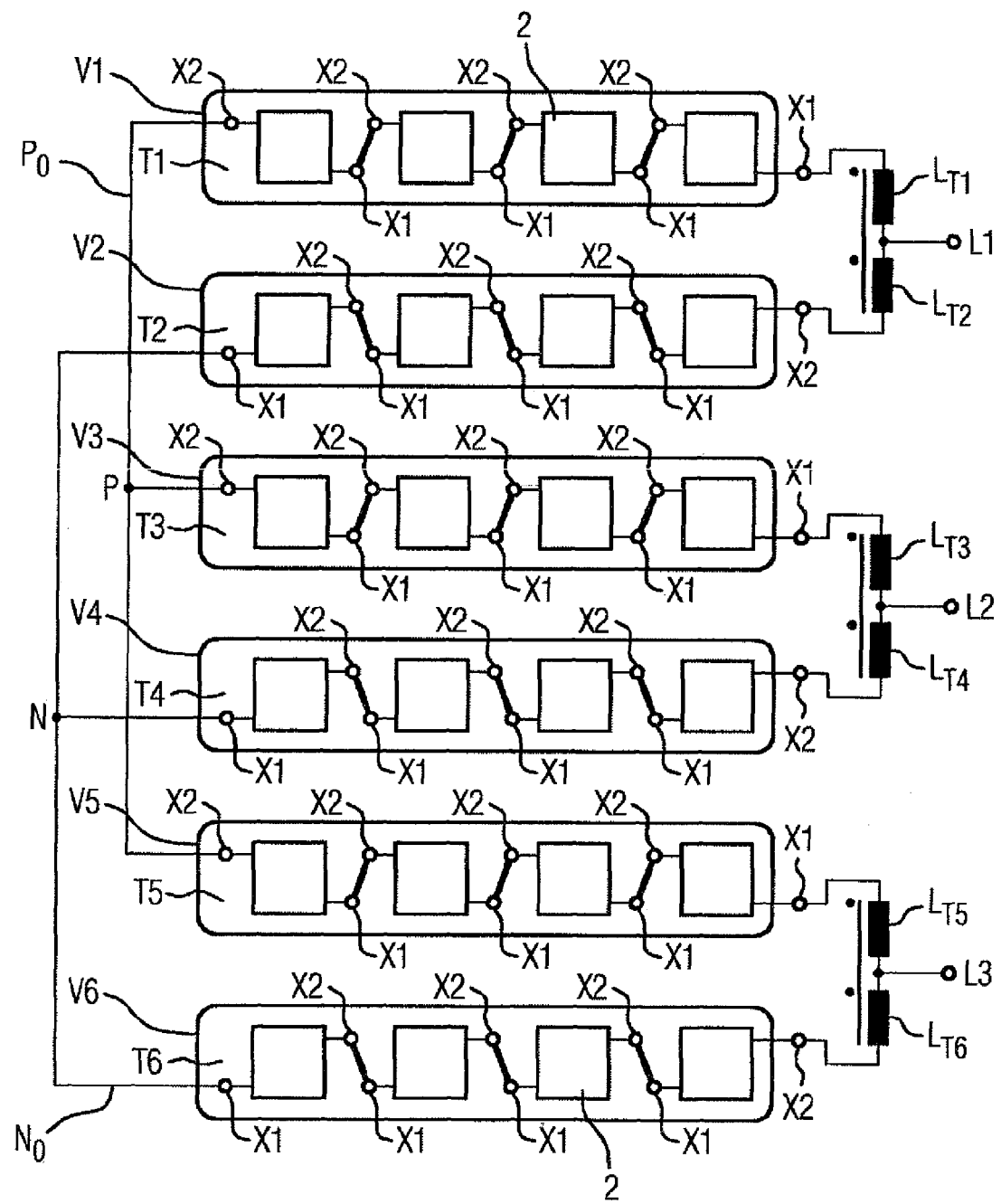
FIGS. 7-9 show different equipment plans of the valve levels of the cell converter in accordance with FIG. 1.

FIG. 7 shows a first equipping plan of the six valve levels V1, . . . , V6 with converter cells 2 of the modular converter in accordance with the equivalent circuit diagram of FIG. 1. In accordance with this equivalent circuit diagram each converter valve T1, . . . , T6 has four converter cells 2 which are connected electrically in series. In accordance with this equivalent circuit diagram the three upper converter valves T1, T3 and T5 are each connected with a first terminal to a positive potential bus bar $P_0$, while their second terminals are connected electrically-conductively to a terminal of a branch inductor $L_{T1}$, $L_{T3}$ or $L_{T5}$. The lower converter valves T2, T4 and T6 are each connected by a first terminal to a negative potential bus bar $N_0$, while their second terminals in each case are connected electrically-conductively to a terminal of a branch inductor $L_{T2}$, $L_{T4}$ or $L_{T6}$. A connection point of two branch inductors $L_{T1}$, $L_{T2}$ or $L_{T3}$, $L_{T4}$ or $L_{T5}$, $L_{T6}$ of a phase 1 or 3 or 5 forms a converter output $L_1$ or $L_2$ or $L_3$.

The two valve cabinets 24 and 26 have a valve level V1, . . . V6 for each converter valve T1, . . . , 16, which are sequentially numbered from top to bottom for example. Each three-phase modular cell converter has six converter valves T1, . . . T6, while a single-phase modular cell converter has only four converter valves T1, . . . T6. Thus the two valve cabinets 24 and 26 must accordingly have valve levels V1, . . . , V6 in accordance with the number of available converter valves T1, . . . , T6, which must be disposed either in ascending or descending order in valve cabinet 24 or 26 above one another. In the three equipping plans in accordance with FIG. 7 to FIG. 9 the six valve levels are arranged beginning in descending order from the bottom (beginning in ascending order from the top).

In accordance with the equipping plan of FIG. 7 the converter cells 2 of the converter valve T1 are disposed in the first valve level V1 and those of the converter valve T2 in the second valve level V2. The converter cells 2 of the converter valves T3 or T4 of the second phase module 3 are disposed in the valve levels V3 or V4. The converter cells 2 of the converter valves T5 and T6 of the third phase module 5 of the modular converter are disposed in the valve levels V5 and V6. That means that the converter cells 2 of the converter valves T1, T2 or T3, T4 or T5, T6 of each phase module 1 or 3 or 5 are accommodated in two neighboring valve levels V1, V2 or V3, V4 or V5, V6. With this equipping plan the branch inductors $L_{T1}$, $L_{T2}$ or $L_{T3}$, $L_{T4}$ or $L_{T5}$, $L_{T6}$ of each phase module 1, 3 and 5 can be connected to the converter valves T1, T2 or T3, T4 or T5, T6 of the corresponding phase modules. That means that the bus bar layout of the inductor terminals is an especially simple design. The bus bar layout of the upper converter valves T1, T3 and T5 and of the lower converter valves T2, T4 and T6 is of a somewhat more complex design, since the converter valves T1, T3 and T5 or T2, T4, T6, which are electrically-conductively connected to the positive or negative potential bars $P_0$ or $N_0$, are disposed in valve levels V1, V3, V5 or V2, V4, V6 spaced apart from one another.

Figure 8:
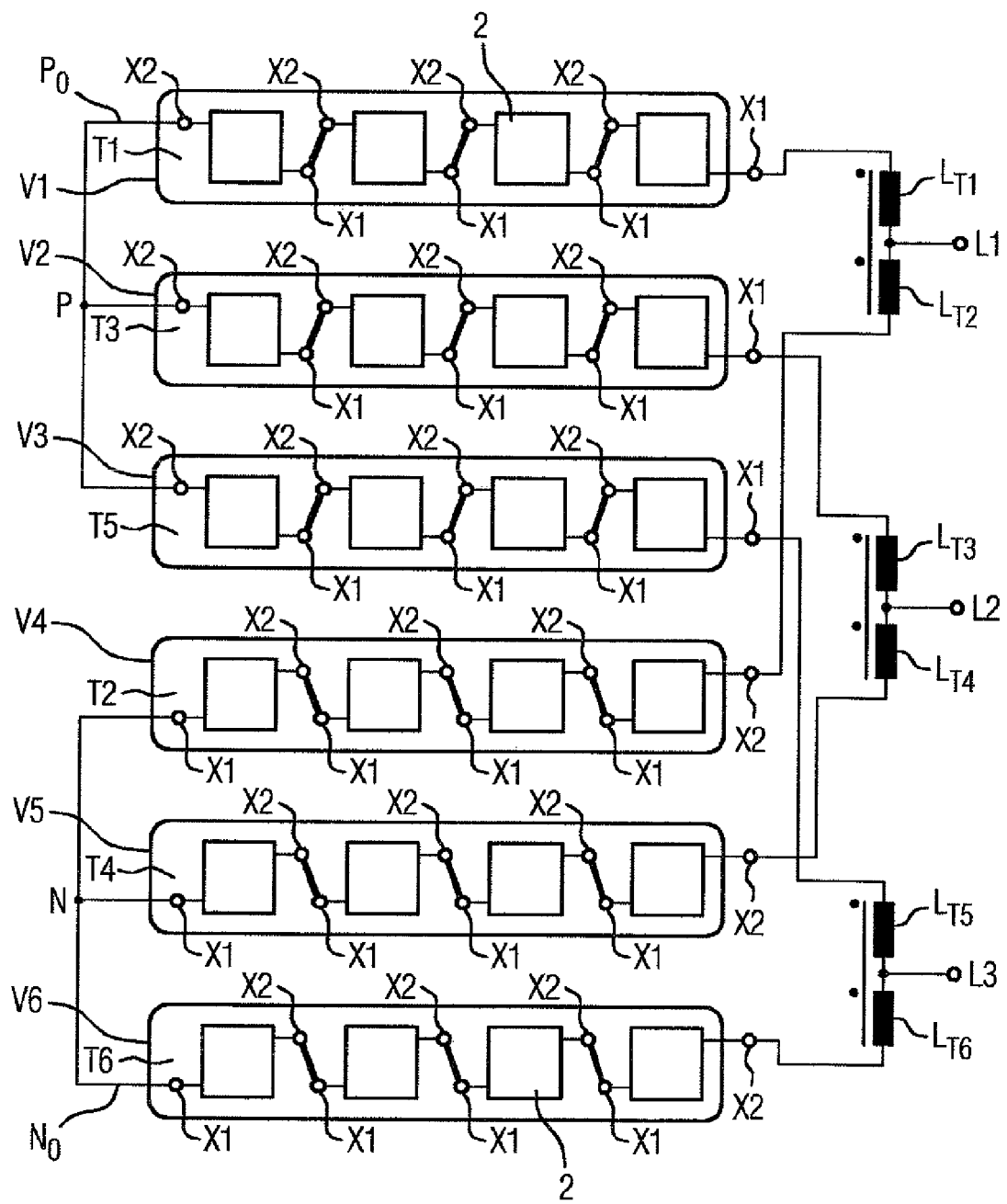

While by contrast in accordance with the equipping plan of FIG. 8 the converter cells 2 of the upper converter valves T1, T3 and T5 are accommodated in neighboring upper valve levels V1, V2 and V3 and the converter cells 2 of the lower converter valves T2, T4 and T6 are accommodated in lower neighboring valve levels V4, V5 and V6, the DC voltage-side bus bar system is simplified, wherein the positive and negative potential bars $P_0$ and $N_0$ can be arranged spaced apart from one another. The disadvantage of this equipping plan is the more complex bus bar system of the branch inductors $L_{T1}$, . . . , $L_{T6}$, since the two converter valves T1, T2 or T3, T4 or T5, T6 of a phase module are always spatially separated from one another by two valve levels V2, V3 or V3, V4 or V4, V5.

Figure 9:
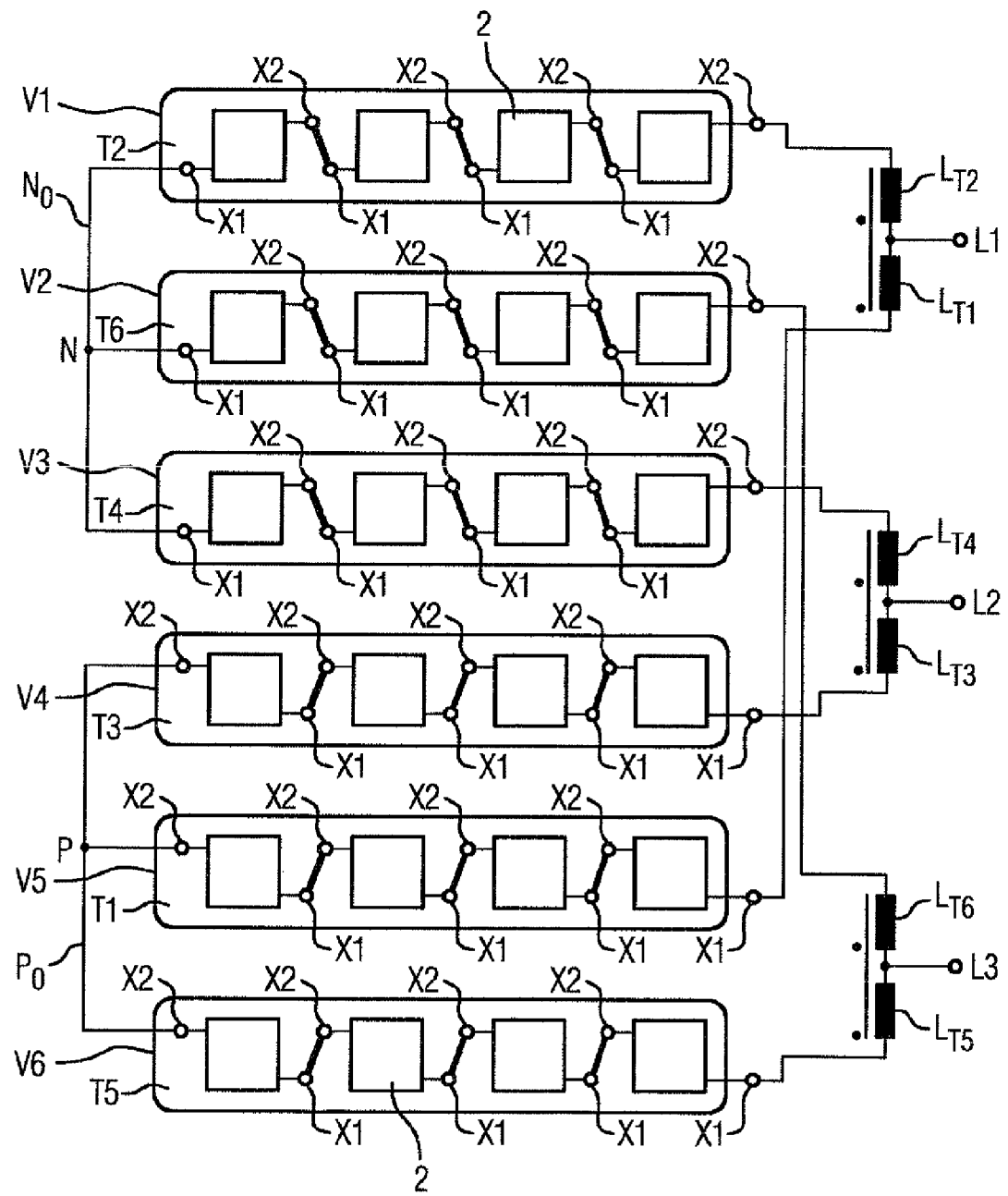

FIG. 9 shows a further equipping plan of the valve levels V1, . . . , V6 of the valve cabinets 24 and 26 with converter cells 2 of the converter valves T1, . . . , T6. This equipping plan differs from the equipping plan in accordance with FIG. 8 in that the arrangement of the upper and lower converter valves T1, T3, T5 and T2, T4, T6 have been swapped over within the valve cabinet 24 or 26. That means that the upper converter valves T1, T3, T5 are now in the lower valve levels V4, V5 and V6 and the lower converter valves T2, T4, T6 of the modular converter according to FIG. 1 are disposed in the upper valve levels V1, V2, V3. In addition the accommodation of the converter cells 2 of the converter valves T4, T6 and T1, T3 in the valve levels V2, V3 and V4, V5 is swapped such that now the converter valves T4 and T3 of the phase module 3 are accommodated in the neighboring valve levels T4 and T3 This enables the branch inductors $L_{T3}$ and $L_{T4}$ of the second phase module 3 to be linked electrically-conductively directly to a terminal of the converter valves T3 and T4. Thus the complex bus bar system of the equipping plan in accordance with FIG. 8 is simplified without the simple DC voltage-side bus bar layout having to be modified.

The fact that the converter cells 2 of each converter valve T1, ..., T6 of a modular multi-phase cell converter are each arranged next to one another in a valve level V1, ..., V6, and in accordance with the invention two different valve cabinets 24 and 26 can have bus connections jointly or individually to one inductor cabinet 48, enables each modular multi-phase cell converter to be individually adapted without any great effort to required converter output voltages.

The invention claimed is:

1. A modular converter cabinet system of a converter with at least one phase module having an upper and a lower converter valve, wherein each converter valve has at least two converter cells and a branch inductor which are electrically connected in series, the modular converter cabinet system comprising: a first valve cabinet, a second valve cabinet placed adjacent to the first valve cabinet, and an inductor cabinet placed adjacent to the second valve cabinet, wherein the first and second valve cabinets each have a plurality of valve levels that are vertically spaced apart from one another and a plurality of adjacent honeycomb cells arranged next to one another, each honeycomb cell constructed to accommodate a respective converter cell, wherein the respective adjacent converter cells in the first valve cabinet are connected in series and the respective adjacent converter cells in the second valve cabinet are connected in series and wherein the series-connected converter cells in the first valve cabinet are connected to the series-connected converter cells in the second valve cabinet in series by way of first bus bars extending between the first and second valve cabinets, wherein the inductor cabinet has a plurality of phase levels that are vertically spaced apart from one another, and wherein two valve levels of at least one of the first and second valve cabinets are electrically connected by second bus bars to a respective phase level of the inductor cabinet that is arranged next to the at least one valve cabinet.

2. The modular converter cabinet system of claim 1, wherein the first valve cabinet has two honeycomb cells per valve level.

3. The modular converter cabinet system of claim 1, wherein the second valve cabinet has four honeycomb cells per valve level.

4. The modular converter cabinet system of claim 1, wherein the converter cells of an upper and a lower valve branch of a respective phase module are arranged in honeycomb cells of neighboring valve levels of a valve cabinet.

5. The modular converter cabinet system of claim 1, wherein the converter cells of an upper converter valve of the phase modules of the converter and the converter cells of a lower converter valve of the phase modules of the converter are each arranged in neighboring valve levels of a valve cabinet.

6. The modular converter cabinet system of claim 5, wherein the converter cells of the upper converter valve are arranged in upper valve levels of the neighboring valve levels of a valve cabinet, wherein the upper valve levels are arranged in an order that corresponds to an order of the phase modules of the converter.

7. The modular converter cabinet system of claim 5, wherein the converter cells of the lower converter valve are arranged in lower valve levels of the neighboring valve levels of a valve cabinet, wherein a sequential order of the lower and upper converter valves of the phase modules in upper and lower valve levels of the valve cabinet is selected such that a lower converter valve and an upper converter valve of a phase module are arranged in neighboring valve levels.

8. The modular converter cabinet system of claim 1, wherein two second valve cabinets and the inductor cabinet are electrically connected to one another.

9. The modular converter cabinet system of claim 1, wherein a first valve cabinet, two second valve cabinets and the inductor cabinet are electrically connected to one another.

10. The modular converter cabinet system of claim 1, wherein three second valve cabinets and the inductor cabinet are electrically connected to one another.

11. The modular converter cabinet system of claim 1, wherein the valve levels of a valve cabinet are arranged on top of one another and spaced apart between two side walls.

12. The modular converter cabinet system of claim 11, wherein the two side walls are spaced apart by two spacer bars disposed above the upper valve level and two spacer bars disposed below the lower valve level.

13. The modular converter cabinet system of claim 11, wherein each side wall has on its front side a cutout for each valve level.

14. The modular converter cabinet system of claim 13, wherein cross bars are arranged in the cutouts of two spaced-apart sidewalls.

15. The modular converter cabinet system of claim 11, wherein a support structure of a plurality of converter cells of a valve cabinet is formed of side walls, spacer bars and cross bars and is made of an electrically-insulating material.

16. The modular converter cabinet system of claim 1, wherein a two-pulse subsystem is provided as a converter cell, the two-pulse subsystem having two disconnectable semiconductors connected in series forming a series circuit, a diode connected antiparallel with each disconnectable semiconductor, and a storage capacitor electrically connected in parallel with this series circuit.

17. The modular converter cabinet system of claim 1, wherein a double-submodule is provided as a converter cell, the double-submodule having four disconnectable semiconductors connected in series forming a series circuit, a diode connected antiparallel with each disconnectable semiconductor, and two storage capacitors, wherein these two storage capacitors are connected electrically in series at a midpoint and in parallel with the series circuit, wherein the midpoint is electrically connected to a midpoint of the series circuit.

* * * * *